United States Patent
Deng et al.

(10) Patent No.: US 8,777,086 B2
(45) Date of Patent: Jul. 15, 2014

(54) IMAGE-ASSISTED SYSTEM FOR ADJUSTING A BONDING TOOL

(75) Inventors: Jiang Wen Deng, Hong Kong (CN); Hei Lam Chang, Hong Kong (CN); Tim Wai Mak, Hong Kong (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/451,622

(22) Filed: Apr. 20, 2012

(65) Prior Publication Data

US 2013/0277413 A1 Oct. 24, 2013

(51) Int. Cl.
*B23K 31/02* (2006.01)
*B23K 37/00* (2006.01)

(52) U.S. Cl.
USPC .......... 228/105; 228/102; 228/4.5; 228/180.5

(58) Field of Classification Search
USPC ............................. 228/4.5, 180.5, 9, 102, 105
See application file for complete search history.

(56) References Cited

U.S. PATENT DOCUMENTS

| | | | | |
|---|---|---|---|---|
| 4,855,928 A | * | 8/1989 | Yamanaka | 228/4.5 |
| 5,702,049 A | * | 12/1997 | Biggs et al. | 228/105 |
| 6,464,126 B2 | * | 10/2002 | Hayata et al. | 228/105 |
| 6,467,673 B2 | * | 10/2002 | Enokido et al. | 228/105 |
| 6,762,848 B2 | * | 7/2004 | Hayata et al. | 356/614 |
| 6,857,554 B2 | * | 2/2005 | Hess et al. | 228/103 |
| 7,224,829 B2 | * | 5/2007 | Enokido | 382/145 |
| 7,461,768 B2 | * | 12/2008 | Walther | 228/1.1 |
| 7,527,186 B2 | * | 5/2009 | Beatson et al. | 228/4.5 |
| 2010/0301101 A1 | * | 12/2010 | Seyama et al. | 228/105 |

FOREIGN PATENT DOCUMENTS

EP 2343165 A1 * 7/2011

* cited by examiner

*Primary Examiner* — Devang R Patel
(74) *Attorney, Agent, or Firm* — Sughrue Mion, PLLC

(57) ABSTRACT

A bonding tool is adjusted to a desired operational position by viewing the bonding tool with an image-capturing device and displaying an image of the bonding tool as viewed by the image-capturing device onto a display screen. A corresponding image of a reference bonding tool showing the desired operational position of the bonding tool is superimposed onto the display screen and the position of the bonding tool is adjusted with an adjustment mechanism until the bonding tool as viewed by the image-capturing device is aligned with the superimposed image of the reference bonding tool.

10 Claims, 3 Drawing Sheets

IMAGE-ASSISTED SYSTEM FOR ADJUSTING A BONDING TOOL

FIELD OF THE INVENTION

The invention relates to a system for adjusting a position of a bonding tool, and in particular, using visual aids to adjust the bonding tool.

BACKGROUND AND PRIOR ART

Wire bonders are generally used to connect wires between a semiconductor chip and a substrate. In particular, wedge wire bonders are used to bond heavy wires such as aluminum wire, especially on high power electronic packages. The wedge wire bonder has a bond head that is able to position itself relative to the electronic packages in the X, Y, Z and theta axes for wedge bonding. Having a theta axis is necessary in wedge bonging for aligning the bond head orientation with the wire being fed between a first bond and a second bond.

The bond head further comprises a vibration-generating transducer, such as an ultrasonic transducer, an amplifying horn, and a bonding tool in the form of a wedge attached at one end of the amplifying horn for conducting bonding. Due to the various movement axes of the bond head, the bonding tool needs to be adjusted and aligned along the corresponding axes so as to perform wire bonding operations accurately.

Adjustment of the bonding tool is generally performed manually prior to commencing wire bonding operations. For this purpose, the wire bonding machine usually provides a feature to aid the operator to set up the bonding tool and to fix its position correctly, since the size of the bonding tool is small. A camera may be used to capture an image of the bonding tool and to display it on a monitor. Marking lines representing limits of a tolerance range is overlaid onto the display to facilitate positioning of the bonding tool.

U.S. Pat. No. 7,591,408 entitled "Camera-assisted adjustment of bonding head elements" discloses a method for adjusting a bond head element in relation to an ultrasonic tool. The tip of the ultrasonic tool is optically detected by means of a camera and is displayed in an image on a display device. Markings comprising lines illustrating a tolerance range is superimposed in the display in real time as a positioning aid in order to facilitate adjustment of the ultrasonic tool.

A shortcoming of the approach disclosed in the aforesaid patent is that it requires an additional and relatively complicated set-up procedure to generate and draw the marking lines defining the tolerance field. Further, the marking lines only guide the edge position of the bonding tool, such that it does not assist in adjustment of the bond tool orientation where the bonding tool orientation is incorrect.

SUMMARY OF THE INVENTION

Thus, the invention seeks to provide a more accurate and user-friendly system for adjusting a bonding tool that avoids at least some of the disadvantages of the aforesaid prior art.

According to a first aspect of the invention, there is provided a method for adjusting a bonding tool to a desired operational position, comprising the steps of: viewing the bonding tool with an image-capturing device, and displaying an image of the bonding tool as viewed by the image-capturing device onto a display screen; superimposing onto the display screen a corresponding image of a reference bonding tool showing the desired operational position of the bonding tool; and thereafter adjusting the position of the bonding tool with an adjustment mechanism until the bonding tool as viewed by the image-capturing device is aligned with the superimposed image of the reference bonding tool.

According to a second aspect of the invention, there is provided a system for adjusting a bonding tool to a desired operational position, the system comprising: an image-capturing device operative to view the bonding tool; a display screen showing the bonding tool as viewed by the image-capturing device; the display screen being configured to superimpose a corresponding image of a reference bonding tool located at the desired operational position of the bonding tool; and an adjustment mechanism for adjusting the position of the bonding tool until the bonding tool is aligned with the superimposed image of the reference bonding tool.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENT OF THE INVENTION

Figure 1:
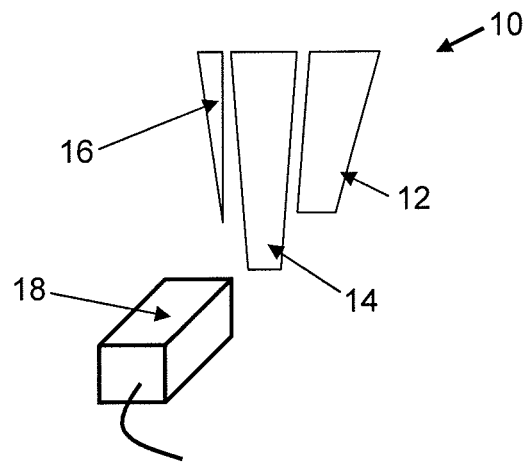
FIG. 1 is a schematic side view of components of a bonding tool and an image-capturing device.

FIG. 1 is a schematic side view of components of a bonding tool 10 and an image-capturing device 18. The bonding tool 10 comprises a wire guide 12 with a groove to guide bonding wire to a bottom surface of a wedge 14, where wire bonding is performed. A wire cutter 16 is located on a side of the wedge 14 that is opposite to the wire guide 12. After electrically connecting separate bonding locations with a wire loop, the wire cutter 16 cuts the bonding wire so that a new wire loop can be formed.

An image-capturing device 18, such as a lipstick camera, is positioned on one side of the bonding tool 10 to view the position and orientation of the bonding tool 10.

Figure 2:
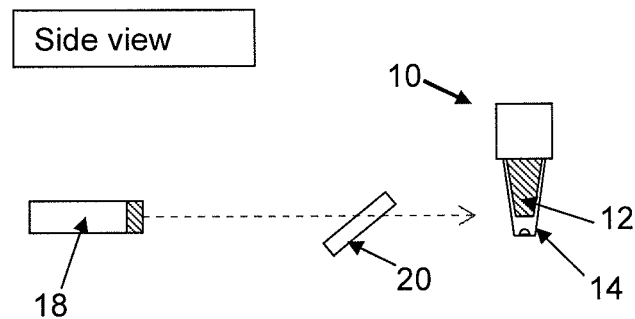
FIG. 2 is a side view of the image-capturing device obtaining an image of a side profile of the bonding tool.

FIG. 2 is a side view of the image-capturing device 18 obtaining an image of a side profile of the bonding tool 10. The bonding tool 10 and/or image-capturing device 18 are moved to a position where a beam splitter 20 is interposed between the image-capturing device 18 and the bonding tool 10. The image-capturing device 18 views the bonding tool 10 from light rays which pass through the beam splitter 20 to obtain a side view of the bonding tool 10.

Figure 3:
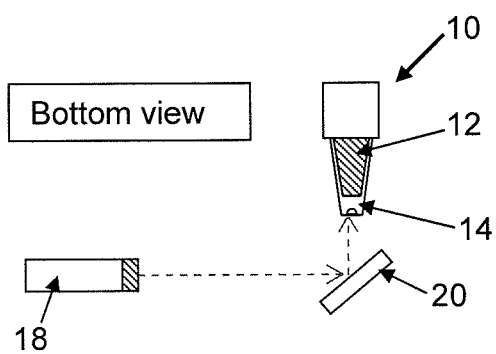
FIG. 3 is a side view of the image-capturing device obtaining an image of a bottom profile of the bonding tool.

FIG. 3 is a side view of the image-capturing device 18 obtaining an image of a bottom profile of the bonding tool 10. The bonding tool 10 is now located over the beam splitter 20. Light rays reflected by the beam splitter 20 allow the image-capturing device 18 to view a bottom surface of the bonding tool 10 in order to adjust and align the bottom surface of the bonding tool 10 accordingly.

Figure 4:
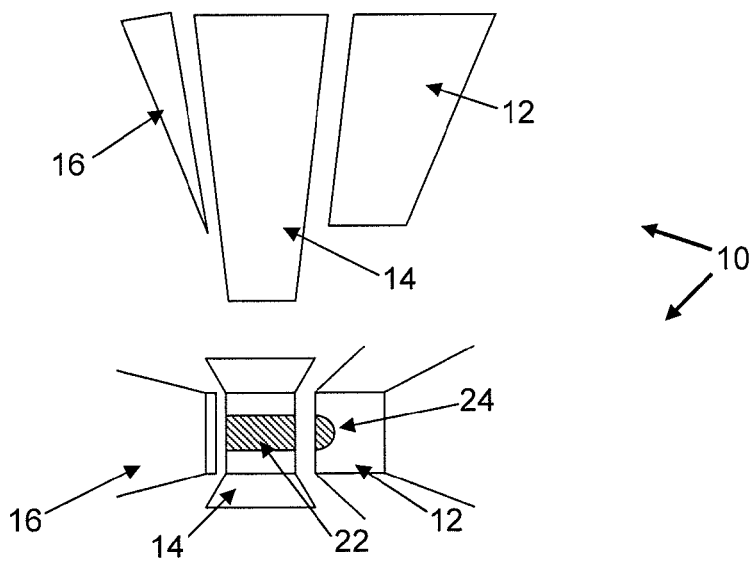
FIG. 4 is an example of views of the bonding tool which may be displayed on a display screen.

FIG. 4 is an example of views of the bonding tool 10 which may be displayed on a display screen. At the top of FIG. 4, a side view of the bonding tool 10 including the wire guide 12, wedge 14 and wire cutter 16 obtained from the set-up in FIG. 2 is illustrated. At the bottom of FIG. 4, a bottom view of the bonding tool 10 including the wire guide 12, wedge 14 and wire cutter obtained from the set-up in FIG. 3 is illustrated. Also illustrated are a wire guide groove 24 and a wedge groove 22 used for positioning the bonding wire during wire bonding. Wire bonding is performed at the bottom surface of the wedge 14 where the wedge groove 22 is located.

The respective side and bottom views of the bonding tool 10 may be shown at the same time or separately depending on requirements and the set-up of the apparatus. For example, with an appropriate optical set-up, both views may be displayed simultaneously. However, for simplicity, according to the preferred embodiment of the invention, the two views are shown to the operator separately for performing the adjustments separately.

Figure 5A:
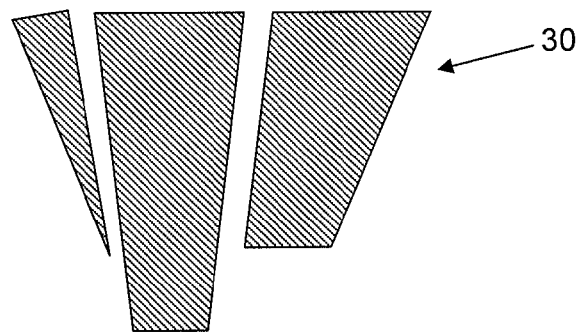
FIGS. 5(a) and 5(b) are side views of a golden reference bonding tool as captured and as a semi-transparent image respectively.

FIG. 5(a) is a side view of a reference bonding tool in the form of a golden reference bonding tool 30 as captured. Such golden reference bonding tool 30 is positioned at an appropriate operational position of the bonding tool where the bonding tool 10 used for wire bonding should ideally be positioned during adjustment and calibration. During offline teaching, the golden reference bonding tool 30 should first be set up by an experienced operator to the appropriate operational position that is desired for conducting bonding operations. Multiple images of the golden reference bonding tool 30 from different directions, especially including side and bottom views of the golden reference bonding tool 30, are then captured corresponding to the directions from which the bonding tool 10 will subsequently be aligned against. These images would be the golden reference models of the ideal bonding tool position and are stored electronically on the bonding machine for later retrieval.

Figure 5B:
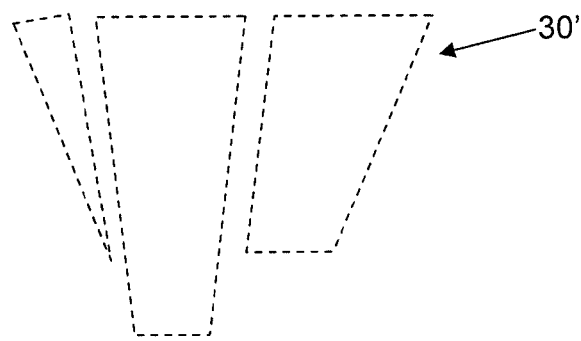

In FIG. 5(b), the side view of the golden reference bonding tool 30 as captured in FIG. 5(a) is converted into a semi-transparent golden reference image 30' for use during adjustment of the bonding tool 10.

Figure 6:
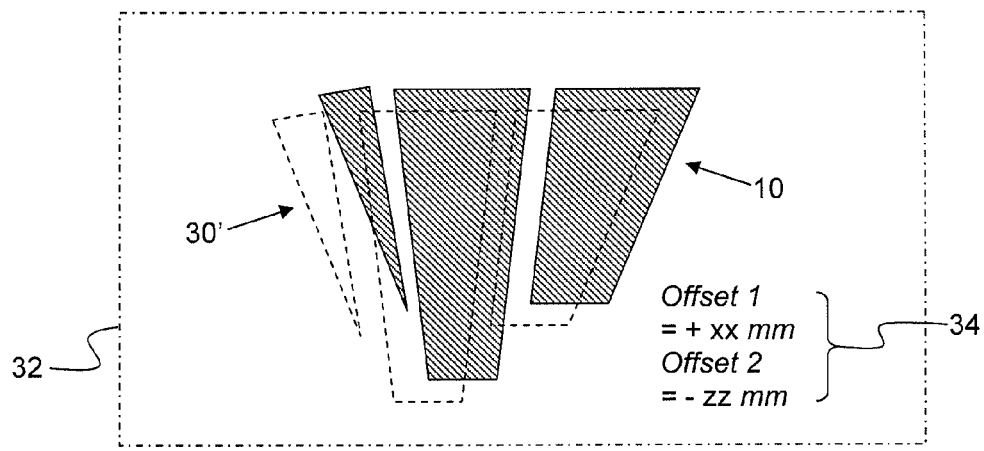
FIG. 6 is a semi-transparent golden reference image of the side view of the golden reference bonding tool which is superimposed onto a side view of the bonding tool.

FIG. 6 is the semi-transparent golden reference image 30' of the side view of the golden reference bonding tool 30 which is superimposed onto a side view of the bonding tool 10 on a display screen 32. The illustration can be seen on the display screen 32 by an operator when the bonding tool 10 is being adjusted. Therefore, instead of using lines on a display screen showing a tolerance range within which a point or the tip of the bonding tool 10 should be located, the semi-transparent golden reference image 30' is superimposed on the display screen 32 in real time for the operator to make a direct comparison and to adjust the bonding tool 10 precisely. Using this view, a height of the bonding tool 10 as well as its horizontal position and rotary orientation may be aligned when the image of the bonding tool 10 corresponds with the semi-transparent golden reference image 30'.

Referring to FIG. 6, the operator will adjust the position of the bonding tool 10 until the image of the bonding tool 10 is aligned and coincident with the semi-transparent side view of the golden reference bonding tool 30'. Alternatively, the bonding machine may automatically adjust the position of the bonding tool 10 by pattern recognition in order to align the image of the bonding tool 10 with the semi-transparent golden reference image 30' without manual intervention by the operator. Thereafter, following automatic alignment by pattern recognition, an operator has an option of performing fine adjustment of the position and orientation of the bonding tool 10 manually to fit the overlaid semi-transparent golden reference image 30'.

Semi-transparent golden reference images 30' showing side and bottom views of a golden reference bonding tool 30 may be respectively superimposed simultaneously on the display screen 32 showing the side and bottom views of the bonding tool 10 for simultaneous three-dimensional adjustment of the bonding tool 10. A further feature is that, during manual adjustment, the vision system can automatically measure the separation distances between the different parts of the bonding tool 10 and digitally display the two-dimensional or three-dimensional offset 34 numerically on the display screen 32. As an additional visual aid to manual adjustment, this separation distance that is numerically expressed can be continually updated on the display screen 32 in real time as the bonding tool 10 is adjusted until the separation distance between aligned parts and the semi-transparent golden reference image 30' is minimal or zero.

Figure 7A:
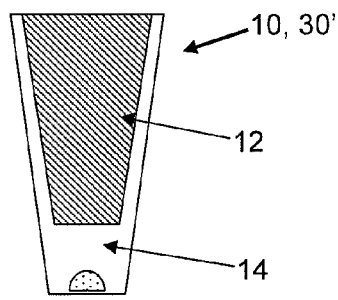
FIGS. 7(a) to 7(c) are exemplary side views of a wire guide and a cutter, and a bottom view of the bonding tool respectively.

Furthermore, the bonding tool 10 can be rotated so that its different sides are viewable by the image-capturing device 18 in order to adjust the relative positions of individual parts of the bonding tool 10. FIG. 7(a) shows the bonding tool 10 having been rotated so that the wire guide 12 is facing the image-capturing device 18. Using a corresponding semi-transparent golden reference image 30' obtained from the wire guide view of the golden reference bonding tool 30, the orientation of the bonding tool 10 from the wire guide view in FIG. 7(a) is adjustable to a desired orientation. Thus, the position of the wire guide 12 relative to the wedge 14 may be adjusted using this view.

Figure 7B:
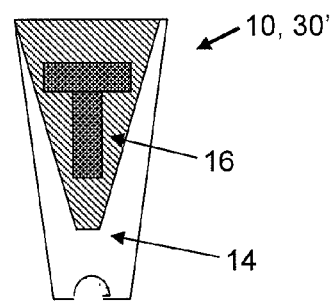

Similarly, FIG. 7(b) shows the bonding tool 10 having been rotated so that the wire cutter 16 is facing the image-capturing device 18. Using a corresponding semi-transparent golden reference image 30' obtained from the cutter view of the golden reference bonding tool 30, the orientation of the bonding tool 10 from the wire cutter in FIG. 7(b) is adjustable to the desired orientation. Hence, the position of the wire cutter 16 relative to the wedge 14 may be adjusted using this view.

Figure 7C:
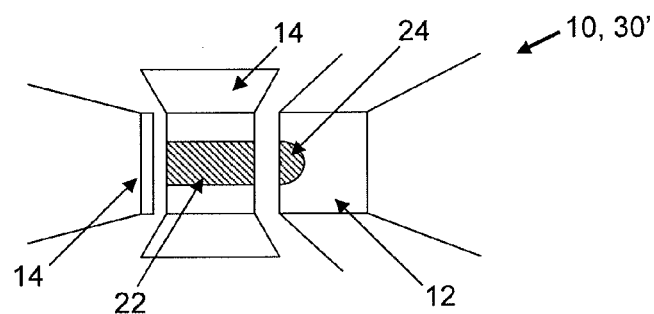

In FIG. 7(c), a bottom view of the bonding tool 10 is displayed. The bottom view of the bonding tool 10 is adjustable according to the semi-transparent golden reference image 30' obtained from the bottom view of the golden reference bonding tool 30 so that the bonding tool 10 is at the appropriate position for performing wire bonding. Using this view, the wedge groove 22 and wire guide groove 24 may be aligned for correctly guiding the bonding wire to the bottom of the wedge 14.

It should be appreciated that the bonding tool adjustment system of the preferred embodiment of the invention offers a simple teach procedure wherein only images of the golden reference bonding tool 30 need to be captured during an offline teaching procedure for comparison and adjustment. There is thus no need to calculate and define a tolerance range as in the prior art.

The overlaid semi-transparent golden reference image 30' makes it more accurate and user-friendly to guide the operator to set up the ideal positions and orientations of the bonding tool 10 utilizing different parts of the bonding tool 10 as guides. On the other hand, marking the display screen 32 with a tolerance range as taught in the prior art can only approximately guide the positions and orientations of the various parts of the bonding tool 10.

The invention described herein is susceptible to variations, modifications and/or additions other than those specifically described and it is to be understood that the invention includes all such variations, modifications and/or additions which fall within the spirit and scope of the above description.

The invention claimed is:

1. A method for adjusting a bonding tool to a desired operational position, comprising the steps of:
    viewing the bonding tool with an image-capturing device located on one side of the bonding tool, and displaying a plurality of images of the bonding tool as viewed by the image-capturing device on a display screen;
    superimposing onto each of the plurality of images of the bonding tool displayed on the display screen a corresponding image of a reference bonding tool showing the desired operational position of the bonding tool; and thereafter
    adjusting the position of the bonding tool with an adjustment mechanism until the bonding tool as viewed by the image-capturing device is aligned with the superimposed image of the reference bonding tool,
    wherein the step of viewing the bonding tool with the image-capturing device includes moving the image-capturing device such that a beam splitter is interposed between the image-capturing device and the bonding tool in order to view a side surface of the bonding tool with the image-capturing device and moving the image-capturing device and the beam splitter such that the beam splitter is located underneath the bonding tool in order to view a bottom surface of the bonding tool with the image-capturing device, in order to obtain multiple images of the bonding tool comprising side and bottom views of the bonding tool, and the step of adjusting the position of the bonding tool with the adjustment mechanism comprises adjusting a rotary orientation of the bonding tool based upon the alignment of the multiple images of the bonding tool with the corresponding superimposed images of the reference bonding tool.

2. The method as claimed in claim 1, wherein side and bottom images of the reference bonding tool are respectively superimposed simultaneously on the display screen showing corresponding side and bottom views of the bonding tool as viewed by image-capturing device.

3. The method as claimed in claim 1, further comprising the prior step of an operator setting up the reference bonding tool at an appropriate operational position of the bonding tool and obtaining an image of the reference bonding tool with the image-capturing device for subsequent adjustment of the position of the bonding tool.

4. The method as claimed in claim 3, further comprising the steps of obtaining multiple images of the reference bonding tool comprising side and bottom views of the reference bonding tool for subsequent adjustment of the position of the bonding tool.

5. The method as claimed in claim 1, further comprising the step of converting the image of the reference bonding tool into a semi-transparent image before the image of the reference bonding tool is superimposed onto the display screen displaying the image of the bonding tool to be adjusted.

6. The method as claimed in claim 1, wherein the position of the bonding tool is automatically aligned by a bonding machine using pattern recognition of the image of the bonding tool to be adjusted as compared to the superimposed image of the reference bonding tool.

7. The method as claimed in claim 6, further comprising the step of manual fine adjustment of the position of the bonding tool by an operator after automatic alignment of the bonding tool by the bonding machine.

8. The method as claimed in claim 1, further comprising the step of displaying on the display screen two-dimensional numerical offset distances between the bonding tool to be adjusted and the position of the reference bonding tool and continually updating the offset distances displayed during adjustment of the bonding tool.

9. The method as claimed in claim 1, wherein the bonding tool is a wedge wire bonding tool, and a side view of the bonding tool comprises views of a wire guide, wedge and wire cutter of the wedge wire bonding tool.

10. The method as claimed in claim 9, wherein a bottom view of the bonding tool includes a view of a wedge groove on the wedge for locating a bonding wire.

* * * * *